(12) United States Patent
Kimura et al.

(10) Patent No.: US 8,125,255 B2
(45) Date of Patent: Feb. 28, 2012

(54) PLL CIRCUIT

(75) Inventors: Hiroki Kimura, Chitose (JP); Naoki Onishi, Chitose (JP); Shoichi Tsuchiya, Chitose (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/929,857

(22) Filed: Feb. 22, 2011

(65) Prior Publication Data
US 2011/0204935 A1  Aug. 25, 2011

(30) Foreign Application Priority Data

Feb. 19, 2010  (JP) ................................ P2010-034758

(51) Int. Cl.
*H03L 7/06* (2006.01)
(52) U.S. Cl. ........................................ 327/156; 327/147
(58) Field of Classification Search .................. 327/147, 327/156
See application file for complete search history.

(56) References Cited

U.S. PATENT DOCUMENTS

| | | | | |
|---|---|---|---|---|
| 5,742,208 | A * | 4/1998 | Blazo | 331/23 |
| 6,359,476 | B2 * | 3/2002 | Hartman et al. | 327/106 |
| 6,577,201 | B2 * | 6/2003 | Ho et al. | 331/16 |
| 6,650,721 | B1 * | 11/2003 | Janesch et al. | 375/376 |
| 6,943,609 | B2 * | 9/2005 | Zampetti et al. | 327/292 |
| 7,773,713 | B2 * | 8/2010 | Cafaro et al. | 375/373 |
| 7,932,732 | B2 * | 4/2011 | Ellis et al. | 324/633 |
| 2002/0180498 | A1 * | 12/2002 | O'Leary et al. | 327/156 |
| 2003/0094982 | A1 * | 5/2003 | Zampetti et al. | 327/159 |
| 2003/0112043 | A1 * | 6/2003 | Takahashi | 327/156 |
| 2004/0164776 | A1 * | 8/2004 | Zampetti et al. | 327/156 |
| 2005/0110537 | A1 * | 5/2005 | Wurzer | 327/156 |
| 2007/0182467 | A1 * | 8/2007 | Nakamuta | 327/156 |
| 2008/0136473 | A1 * | 6/2008 | Bollenbeck et al. | 327/156 |
| 2008/0265999 | A1 * | 10/2008 | Wan et al. | 331/16 |
| 2009/0108891 | A1 * | 4/2009 | Sander et al. | 327/156 |
| 2010/0315137 | A1 * | 12/2010 | Kimura | 327/156 |
| 2011/0032013 | A1 * | 2/2011 | Nelson et al. | 327/156 |
| 2011/0074475 | A1 * | 3/2011 | Akaike et al. | 327/156 |
| 2011/0148531 | A1 * | 6/2011 | Schoepf et al. | 331/18 |
| 2011/0159835 | A1 * | 6/2011 | Xuan et al. | 455/323 |
| 2011/0204935 | A1 * | 8/2011 | Kimura et al. | 327/156 |

FOREIGN PATENT DOCUMENTS

| | | |
|---|---|---|
| JP | 03-268510 | 11/1991 |
| JP | 06-112858 | 4/1994 |
| JP | 07-131343 | 5/1995 |
| JP | 07-170180 | 7/1995 |
| JP | 08-107314 | 4/1996 |

(Continued)

*Primary Examiner* — Lincoln Donovan
*Assistant Examiner* — Adam Houston
(74) *Attorney, Agent, or Firm* — Jacobson Holman PLLC

(57) ABSTRACT

Provided is a PLL circuit improving reliability while suppressing power consumption without degrading noise characteristics. The PLL circuit includes a PLL IC that divides an output frequency Fout from a VCO, compares phase with a reference signal, and feeds back a phase difference as a control voltage to the VCO. A control circuit is capable of finely setting both of a reference frequency Fref and an output frequency Fdds in a DDS circuit, and the DDS circuit generates folding signals of Fdds for Fref and an integral multiple frequency thereof based on the combination of the frequencies. A first AMP amplifies a signal, a variable filter selects a desired Fdds (desired) and a second AMP amplifies the signal and supplies the same to the PLL IC as a reference signal. The control circuit further supplies a division ratio N to the PLL IC.

16 Claims, 8 Drawing Sheets

FOREIGN PATENT DOCUMENTS

| | | |
|---|---|---|
| JP | 08-256058 | 10/1996 |
| JP | 08-307259 | 11/1996 |
| JP | 09-023158 | 1/1997 |
| JP | 2002-141797 | 5/2002 |
| JP | 2007-208367 | 8/2007 |
| JP | 2009-153009 | 7/2009 |

* cited by examiner

FIG.5

| | | | | | | | | | | Fdds (MHz) | | | | | | | | | | |
|---|---|---|---|---|---|---|---|---|---|---|---|---|---|---|---|---|---|---|---|---|
| Fref x 1 | 40 | 10 | 11 | 12 | 13 | 14 | 15 | 16 | 17 | 18 | 19 | 20 |
| | | 30 | 29 | 28 | 27 | 26 | 25 | 24 | 23 | 22 | 21 | 20 |
| Fref x 2 | 80 | 50 | 51 | 52 | 53 | 54 | 55 | 56 | 57 | 58 | 59 | 60 |
| | | 70 | 69 | 68 | 67 | 66 | 65 | 64 | 63 | 62 | 61 | 60 |
| Fref x 3 | 120 | 90 | 91 | 92 | 93 | 94 | 95 | 96 | 97 | 98 | 99 | 100 |
| | | 110 | 109 | 108 | 107 | 106 | 105 | 104 | 103 | 102 | 101 | 100 |
| Fref x 4 | 160 | 130 | 131 | 132 | 133 | 134 | 135 | 136 | 137 | 138 | 139 | 140 |
| | | 150 | 149 | 148 | 147 | 146 | 145 | 144 | 143 | 142 | 141 | 140 |
| | | 170 | 171 | 172 | 173 | 174 | 175 | 176 | 177 | 178 | 179 | 180 |

PLL CIRCUIT

This application has a priority of Japanese no. 2010-034758 filed Feb. 19, 2010, hereby incorporated by reference.

BACKGROUND OF THE INVENTION

1. Field of the Invention

The present invention relates to a phase locked loop (PLL) circuit, and more particularly relates to a PLL circuit capable of improving reliability while suppressing power consumption without degrading noise characteristics.

2. Description of the Related Art

[Conventional PLL Circuit: FIG. 9]

Referring to FIG. 9, a conventional PLL circuit is described below. FIG. 9 illustrates the configuration of a conventional PLL circuit.

As illustrated in FIG. 9, the conventional PLL circuit includes a voltage controlled oscillator (VCO) 1; a PLL integrated circuit (PLL IC: phase comparator) 2; an analog filter 3; a reference oscillator 4; a direct digital synthesizer (DDS) circuit 5; and a control circuit 6.

The VCO 1 outputs a desired oscillatory frequency Fout in accordance with a control voltage output from the analog filter 3.

The PLL IC 2 receives the oscillatory frequency Fout as input, divides the frequency with a setting value for division ratio supplied from the control circuit 6 using an output frequency Fdds from the DDS circuit 5 as a reference signal (clock), and outputs the divided frequency to the analog filter 3.

The analog filter 3 smoothes the divided frequency from the PLL IC 2 and outputs the same as a control voltage to the VCO 1.

The reference oscillator 4 includes a voltage controlled crystal oscillator (VCXO), a temperature compensated crystal oscillator (TCXO), an oven controlled crystal oscillator (OCXO) or the like, and outputs a reference frequency Fref to the DDS circuit 5 in accordance with a reference frequency selection signal from the control circuit 6.

The DDS circuit 5 outputs, to the PLL IC 2, an output frequency Fdds generated based on the reference frequency Fref from the reference oscillator 4 in accordance with the Fdds selection signal from the control circuit 6.

The control circuit 6 outputs the reference frequency selection signal to the reference oscillator 4, outputs the Fdds selection signal to the DDS circuit 5, and outputs the setting data for division ratio to the PLL IC 2.

[Operation of the Conventional PLL Circuit]

In the conventional PLL circuit, the control circuit 6 outputs, to the PLL IC 2 and the DDS circuit 5, data (setting data for division ratio, Fdds selection signal) serving as a preset channel (frequency) in a system including the PLL circuit used as an oscillator for setting.

The PLL IC 2 decides a division ratio and a counter value based on the setting data, and the DDS circuit 5 decides any output frequency Fdds used as a reference signal for the PLL IC 2. Thereby, the VCO output will be a preset frequency Fout.

[Related Art]

Related art includes: Japanese Patent Application Laid-Open No. H07-131343 "Frequency synthesizer" (Applicant: ICOM INC/Patent Document 1), Japanese Patent Application Laid-Open No. 2007-208367 "Synchronizing signal generating apparatus, transmitter, and control method" (Applicant: Kenwood Corp/Patent Document 2), and Japanese Patent Application Laid-Open No. 2002-141797 "Frequency synthesizer" (Applicant: Mitsubishi Electric Corp/Patent Document 3).

Patent Document 1 discloses a frequency synthesizer, in which a memory stores a set of a reference frequency switching signal and a DDS output frequency switching signal for each output frequency and when the PLL circuit is locked, an unnecessary wave component is driven away from a pass band.

Patent Document 2 discloses a synchronizing signal generating apparatus, in which a frequency division ratio N of a frequency divider (1/N), an output frequency/input frequency of a DDS, a frequency division ratio Ma of a frequency divider (1/Ma) and a number of multiple Mb of a multiplier (×Mb) are adjusted so that the transmission wave has the instructed frequency and a combination of the input frequency and the output frequency in the DDS has spurious in the output of the DDS at a prescribed level or below.

Patent Document 3 discloses a frequency synthesizer that lets the output of DDS pass through a narrow-band variable frequency filter before inputting it to a phase synchronous loop, so as to change a center frequency of the filter, thus removing spurious.

SUMMARY OF THE INVENTION

When the conventional PLL circuits are used as a synthesizer, a plurality of channel outputs is enabled by changing the settings of the DDS circuit output frequency Fdds and the PLL IC. However, there is an upper limit for the frequency Fdds that can be output for the DDS, and therefore the division ratio in the PLL IC has to be increased to increase the oscillatory frequency Fout.

An increase in division ratio in the PLL IC, however, causes a problem of degradation in noise characteristics obtained with the Fdds.

For instance in the case of the division ratio of 100, the degradation of 20 log 100=40 dB will be involved.

Further, an increase in DDS circuit output frequency itself leads to an increase in power consumption of the circuit and leads to a problem in decrease in reliability of the PLL circuit.

Note that Patent Documents 1, 2 and 3 do not disclose the configuration of using folding frequencies of Fdds for the reference frequency and an integral multiple of the reference frequency to generate Fdds (desired), thus allowing a desired frequency to be selected.

In view of the above-stated circumstances, it is an object of the present invention to provide a PLL circuit capable of improving reliability while suppressing power consumption without degrading noise characteristics.

In order to cope with the above-stated problems in the conventional techniques, a PLL circuit of the present invention includes a voltage controlled oscillator and phase comparison means that frequency-divides an output of the voltage controlled oscillator, compares phase between the output and a reference signal and outputs a signal based on a phase difference as a control voltage for the voltage controlled oscillator. The PLL circuit includes: a reference oscillator that makes a reference frequency variable in accordance with a reference frequency selection signal and outputs the reference frequency; a DDS circuit that outputs an output signal based on a reference frequency input and in response to an external output instruction signal, while outputting a folding signal of an output signal for the reference frequency and an integral multiple of the reference frequency; a first amplifier that amplifies an output signal from the DDS circuit with a first amplification setting value externally input; a variable filter that makes a frequency pass band thereof variable in accordance with a variable frequency setting value externally input and lets an output signal from the first amplifier pass therethrough; a second amplifier that amplifies an output signal from the variable filter with a second amplification setting value externally input and outputs the amplified signal to the phase comparison means as a reference signal; and a control circuit that, when an instruction signal is input to instruct to make the reference signal at a desired frequency, outputs a reference frequency selection signal corresponding to the instruction signal to the reference oscillator, outputs an output instruction signal corresponding to the instruction signal to the DDS circuit, outputs a first amplification setting value corresponding to the instruction signal to the first amplifier, outputs a variable frequency setting value corresponding to the instruction signal to the variable filter, outputs a second amplification setting value corresponding to the instruction signal to the second amplifier, and outputs a division ratio to the phase comparison means. Thus, the PLL circuit of the present invention is capable of generating a desired reference signal over a fine and wide range for selection and has the advantages of improving reliability of the circuit while suppressing power consumption without degrading noise characteristics.

In the PLL circuit of the present invention, the control circuit may output a reference frequency selection signal and an output instruction signal that make both of a reference frequency in the reference oscillator and an output signal in the DDS circuit variable so as to make a reference signal at a desired frequency.

In the PLL circuit of the present invention, the control circuit may make the DDS circuit generate a folding frequency of an output signal for a reference frequency and an integral multiple of the reference frequency and may output a variable frequency setting value to allow the variable filter to select a desired frequency so as to make a reference signal at the desired frequency.

In the PLL circuit of the present invention, the control circuit may include a frequency table that stores a reference frequency selection signal and an output instruction signal so as to correspond to an instruction signal input, a setting value correspondence table that stores a first amplification setting value, a second amplification setting value, a variable frequency setting value and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, variable frequency setting value and division ratio.

A PLL circuit of the present invention includes a voltage controlled oscillator and phase comparison means that frequency-divides an output of the voltage controlled oscillator, compares phase between the output and a reference signal and outputs a signal based on a phase difference as a control voltage for the voltage controlled oscillator. The PLL circuit includes: a reference oscillator that makes a reference frequency variable in accordance with a reference frequency selection signal and outputs the reference frequency; a DDS circuit that outputs an output signal based on a reference frequency input and in response to an external output instruction signal, while outputting a folding signal of an output signal for the reference frequency and an integral multiple of the reference frequency; a first amplifier that amplifies an output signal from the DDS circuit with a first amplification setting value externally input; a plurality of filters each having a different frequency pass band characteristic; a first switch that selects one of the plurality of filters in accordance with a selection signal externally input and outputs an output signal from the first amplifier to the selected filter; a second switch that selects the selected filter in accordance with a selection signal externally input and outputs an output signal from the filter; a second amplifier that amplifies an output signal from the second switch with a second amplification setting value externally input and outputs the amplified signal to the phase comparison means as a reference signal; and a control circuit that, when an instruction signal is input to instruct to make the reference signal at a desired frequency, outputs a reference frequency selection signal corresponding to the instruction signal to the reference oscillator, outputs an output instruction signal corresponding to the instruction signal to the DDS circuit, outputs a first amplification setting value corresponding to the instruction signal to the first amplifier, outputs a second amplification setting value corresponding to the instruction signal to the second amplifier, outputs a selection signal corresponding to the instruction signal to the first switch and the second switch, and outputs a division ratio to the phase comparison means. Thus, the PLL circuit of the present invention is capable of generating a desired reference signal over a fine and wide range for selection and has the advantages of improving reliability of the circuit while suppressing power consumption without degrading noise characteristics.

In the PLL circuit of the present invention, the control circuit may output a reference frequency selection signal and an output instruction signal that make both of a reference frequency in the reference oscillator and an output signal in the DDS circuit variable so as to make a reference signal at a desired frequency.

In the PLL circuit of the present invention, the control circuit may make the DDS circuit generate a folding frequency of an output signal for a reference frequency and an integral multiple of the reference frequency and may output a selection signal to allow the first switch and the second switch to select a desired frequency so as to make a reference signal at the desired frequency.

In the PLL circuit of the present invention, the control circuit may include a frequency table that stores a reference frequency selection signal and an output instruction signal so as to correspond to an instruction signal input, a setting value correspondence table that stores a first amplification setting value, a second amplification setting value, a selection signal and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, selection signal and division ratio.

BRIEF DESCRIPTION OF THE DRAWINGS

FIG. 5 illustrates exemplary Fdds (desired) obtained.

DESCRIPTION OF REFERENCE NUMERALS

1: VCO, 2: PLL IC, 3: analog filter, 4: reference oscillator, 5: DDS circuit, 6: control circuit, 7 first amplifier (AMP), 8: variable filter, 8a: filter, 8b: filter, 8c: filter, 9: second amplifier (AMP), 10a: first switch (SW(1)), 10b: second switch (SW(2)), 51: adder, 52: flip-flop, 53: sine-wave table, 54: digital/analog converter (DAC), 55: filter, 61: controller, 62: frequency table, 63: setting value correspondence table

DESCRIPTION OF PREFERRED EMBODIMENTS

The following describes embodiments of the present invention, with reference to the drawings.

Summary of Embodiments

In a PLL circuit according to embodiments of the present invention, when an output frequency Fdds of a DDS circuit is set for a reference frequency Fref, folding frequency components such as Fref±Fdds, Fref×2±Fdds and Fref×3±Fdds are generated. The present PLL circuit uses these folding frequency components and makes Fref and Fdds variable to obtain a desired Fdds (desired) from the combination the Fref and the Fdds.

Figure 1:
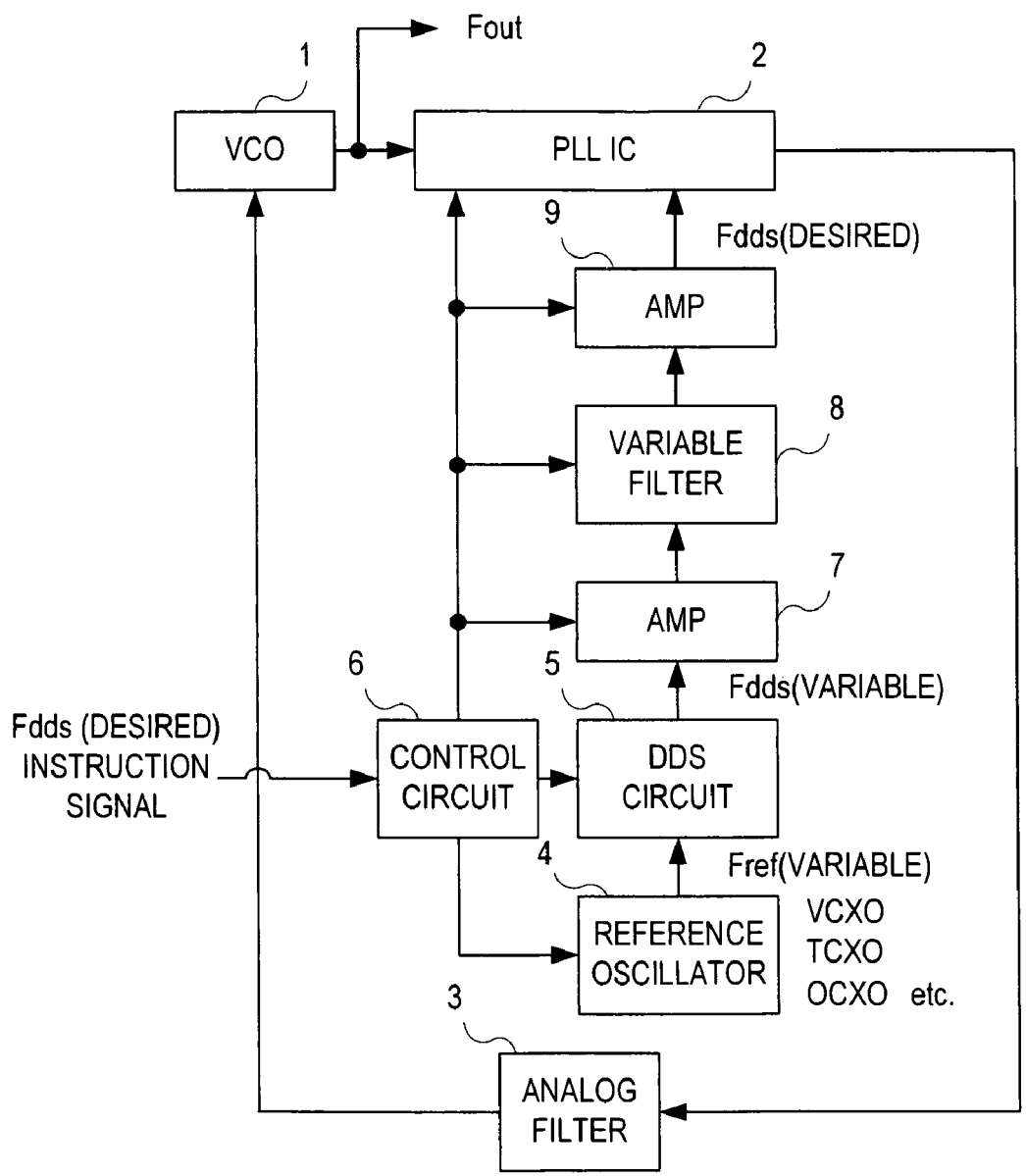
FIG. 1 illustrates the configuration of a first PLL circuit.

[First PLL Circuit: FIG. 1]

Referring to FIG. 1, a PLL circuit (first PLL circuit) according to a first embodiment of the present invention is described below. FIG. 1 illustrates the configuration of the first PLL circuit.

As illustrated in FIG. 1, the first PLL circuit includes a VCO 1, a PLL IC 2, an analog filter 3, a reference oscillator 4, a DDS circuit 5, a control circuit 6, a first amplifier (AMP) 7, a variable filter 8, and a second amplifier (AMP) 9.

[Various Units]

Various units of the first PLL circuit are described below.

The VCO 1 outputs a desired oscillatory frequency Fout in accordance with a control voltage output from the analog filter 3.

The PLL IC 2 is a phase comparator or phase comparison means that receives the oscillatory frequency Fout as input, divides the frequency with a setting value for division ratio supplied from the control circuit 6 using an output frequency Fdds (desired) output from the DDS circuit 5 via the second amplifier 9 as a reference signal (clock), and outputs the divided frequency to the analog filter 3.

The analog filter 3 smoothes the divided frequency from the PLL IC 2 and outputs the same as a control voltage to the VCO 1.

The reference oscillator 4 includes a VCXO a TCXO, an OCXO or the like, and outputs a reference frequency Fref to the DDS circuit 5 in accordance with a reference frequency selection signal from the control circuit 6.

The DDS circuit 5 generates Fdds based on the reference frequency Fref from the reference oscillator 4 in accordance with a Fdds selection signal from the control circuit 6, and outputs the Fdds to the first AMP 7.

Herein, in the DDS circuit 5, not only Fdds but also folding frequencies of the reference frequency Fref and a multiple frequency Fref×n including ±Fdds are generated, and these frequency signals also will be output from the DDS circuit 5 to the first AMP 7.

The control circuit 6 outputs the reference frequency Fref selection signal to the reference oscillator 4, outputs the Fdds selection signal to the DDS circuit 5, outputs amplification setting values 1 and 2 to the first AMP 7 and the second AMP 9, outputs a variable frequency setting value to the variable filter 8, and outputs the setting data for division ratio to the PLL IC 2.

The internal configuration and the processing by the control circuit 6 will be described later.

The first amplifier (AMP) 7 amplifies the output signal from the DDS circuit 5 with an amplification setting value 1 from the control circuit 6 so as to correspond to a selected signal.

The variable filter 8 makes a pass band thereof variable in accordance with a variable frequency setting value from the control circuit 6 so as to let a signal (selected signal) from the first AMP 7 pass therethrough, and outputs the same to the second AMP 9.

The second amplifier (AMP) 9 amplifies the output signal from the variable filter 8 with an amplification setting value 2 from the control circuit 6 so as to correspond to a selected signal.

Figure 2:
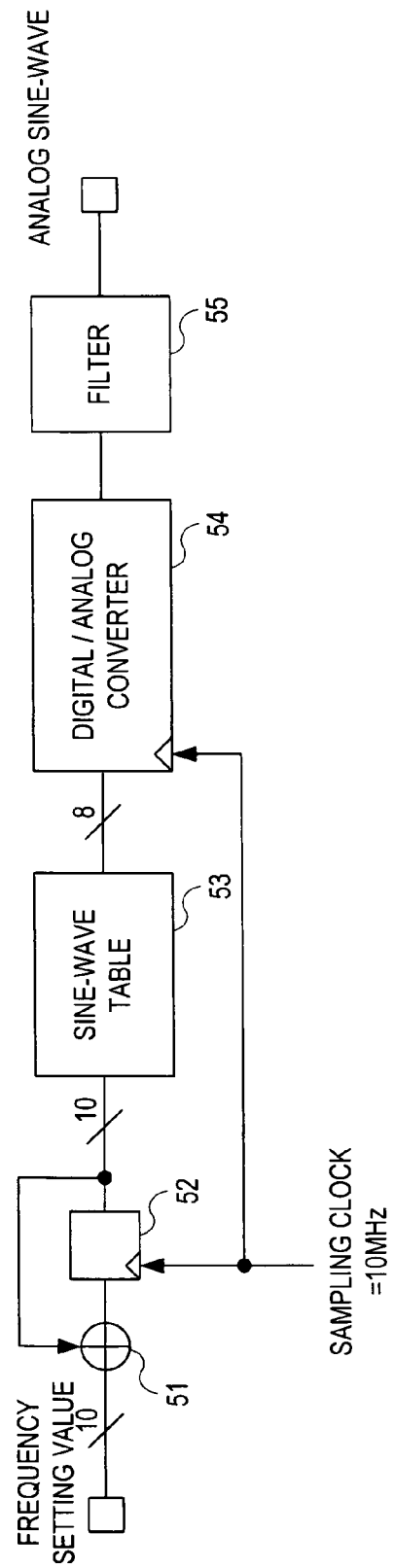
FIG. 2 exemplifies the configuration of a DDS circuit.

[DDS Circuit: FIG. 2]

Referring next to FIG. 2, the DDS circuit 5 is described below. FIG. 2 exemplifies the configuration of the DDS circuit.

As illustrated in FIG. 2, the DDS circuit 5 includes: an adder 51; a flip-flop 52; a sine-wave table 53; a digital/analog converter (DAC) 54; and a filter 55.

The flip-flop 52 and the DAC 54 receive a sampling clock based on the reference frequency Fref from the reference oscillator 4 as input.

The adder 51 adds a frequency setting value input from the control circuit 6 and an output vale from the flip-flop 52, and outputs the same to the flip-flop 52.

The flip-flop 52 performs sampling of the value from the adder 51 with the sampling clock, and outputs a sample value to the adder 51 and the sine-wave table 53.

The sine-wave table 53 is a table that stores an output value of sine-wave corresponding to an input value, reads corresponding data of sine-wave while setting the input value from the flip-flop 52 as a table address, and outputs the same as table data to the DAC 54.

The DAC 54 analog-converts the table data from the sine-wave table 53 using the sampling clock, and outputs the same to the filter 55.

The filter 55 performs filtering of the output from the DAC 54, and outputs the same to the first AMP 7 as an analog sine-wave.

Figure 3:
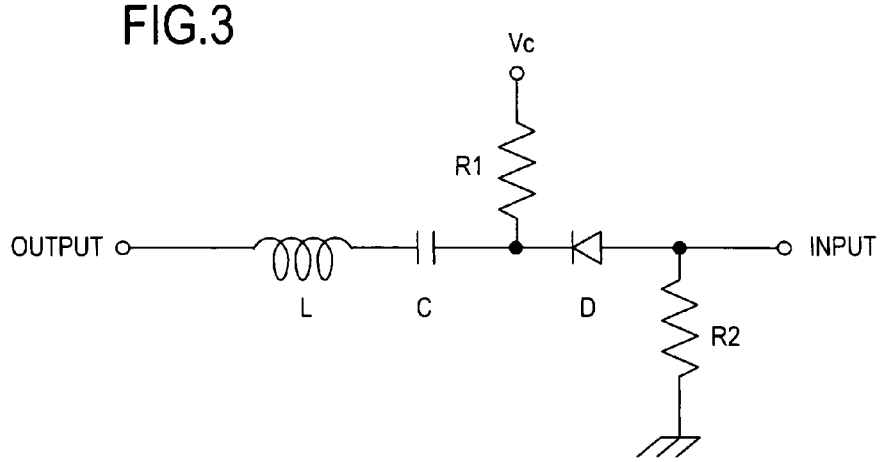
FIG. 3 illustrates example 1 of a variable filter.
Figure 4:
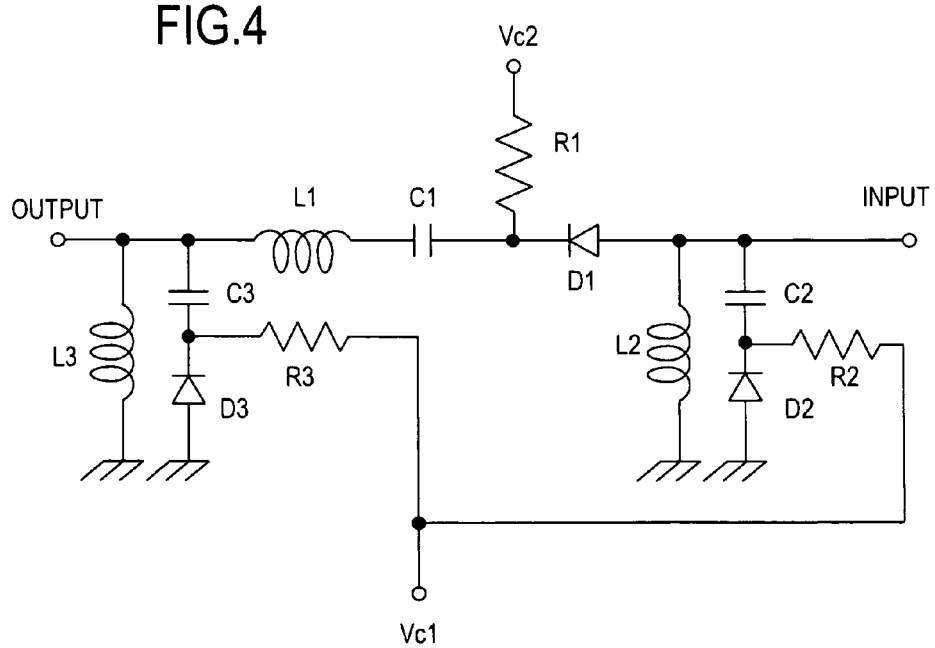
FIG. 4 illustrates example 2 of a variable filter.

[Variable Filter: FIGS. 3 and 4]

Referring next to FIGS. 3 and 4, the variable filter 8 is described below. FIG. 3 illustrates example 1 of the variable filter and FIG. 4 illustrates example 2 of the variable filter.

As illustrated in FIG. 3, a first variable filter includes a variable-capacitance diode D, a capacitor C and a coil L connected in series between an input terminal and an output terminal, where a power supply Vc is applied between the variable-capacitance diode D and the capacitor C via a resistor R1, and one end of a resistor R2 is connected with an input stage, and the other end of the resistor R2 is grounded.

As illustrated in FIG. 4, a second variable filter is based on the first variable filter, including a coil L2 with one end thereof being connected to an input stage and the other end thereof being grounded, a capacitor C2 with one end thereof being connected to the input stage and the other end thereof being connected to the cathode side of a diode D2, the anode side of the diode D2 being grounded, where a voltage Vc1 is connected between the capacitor C2 and the diode D2 via a resistor R2. The output stage has a configuration similar to that of the input stage.

[Example of Fdds (Desired): FIG. 5]

Referring next to FIG. 5, examples of Fdds (desired) obtained from the combination of Fref and Fdds are described below. FIG. 5 illustrates exemplary Fdds (desired) obtained.

FIG. 5 illustrates examples of folding frequencies generated when Fref is fixed at 40 MHz and Fdds is changed from 10 MHz to 20 MHz by 1 MHz at each step.

Conventionally, when Fdds only is changed, frequencies from 10 to 20 MHz only can be obtained. On the other hand, in the example of FIG. 5 where folding frequencies including ±Fdds for the frequency of 40 MHz and multiple frequencies of 40 MHz are used, frequencies ranging from 20 MHz to 30 MHz and 50 MHz to 70 MHz, for example, changing in steps of 1 MHz can be obtained for Fdds (desired).

Further, depending on usages, the changing range of Fdds may be changed as 100 kHz and 10 kHz so as to change Fref, whereby a fine and wide range of Fdds (desired) can be obtained.

Note that the variable filter 8 is provided to increase the selection accuracy of Fdds (desired), and the first AMP 7 and the second AMP 9 are provided to increase the input level of the PLL IC 2.

Figure 6:
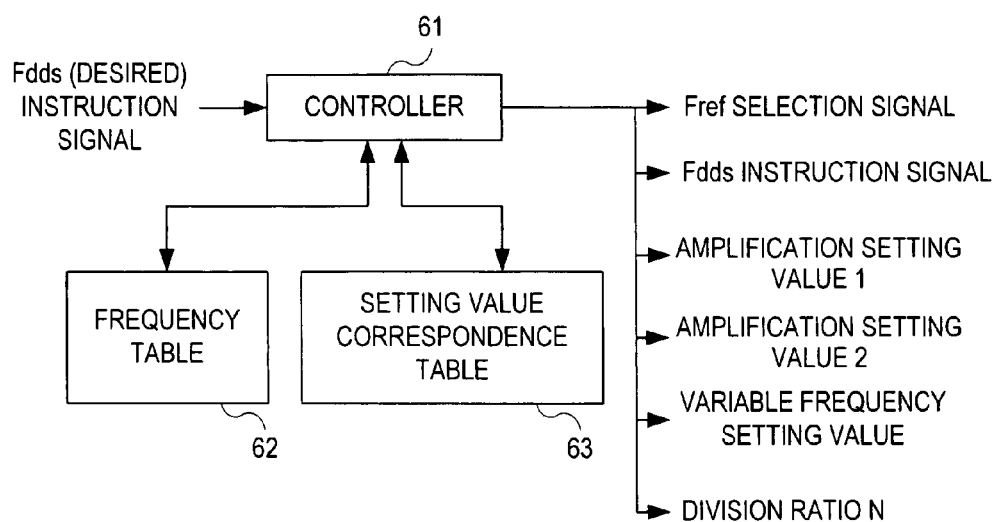
FIG. 6 illustrates the configuration of a control circuit.

[Control Circuit: FIG. 6]

Referring next to FIG. 6, the control circuit 6 is described below. FIG. 6 illustrates the configuration of the control circuit.

As illustrated in FIG. 6, the control circuit 6 basically includes a controller 61, a frequency table 62 and a setting value correspondence table 63.

The controller 61 externally receives a Fdds (desired) instruction signal as input, refers to the frequency table 62 and the setting value correspondence table 63 in accordance with the instruction signal, and outputs the following signals and values.

Herein, the Fdds (desired) instruction signal is an instruction signal enabling a person who configures the PLL circuit to obtain Fdds (desired).

The Fref selection signal specifies the reference frequency Fref at which the reference oscillator 4 oscillates.

The Fdds instruction signal designates Fdds in the DDS circuit 5.

The amplification setting value 1 indicates the amplification setting value in the first AMP 7 corresponding to Fdds (desired), and the amplification setting value 2 indicates such an amplification setting value in the second AMP 9.

The variable frequency setting value is the variable frequency setting value in the variable filter 8 corresponding to Fdds (desired).

The division ratio N indicates a division ratio in the PLL IC 2 corresponding to Fdds (desired).

The frequency table 62 stores a value of the Fref selection signal and a value of the Fdds instruction signal corresponding to the Fdds (desired) instruction signal, and more specifically a correspondence relationship illustrated in FIG. 5 between Fref and Fdds can be obtained from Fdds (desired) based on the table. As stated above, values can be finely set for both of the Fref and the Fdds.

The setting value correspondence table 63 stores amplification setting values 1 and 2, variable frequency setting values and division ratios N beforehand corresponding to Fdds (desired) instruction signals.

Figure 7:
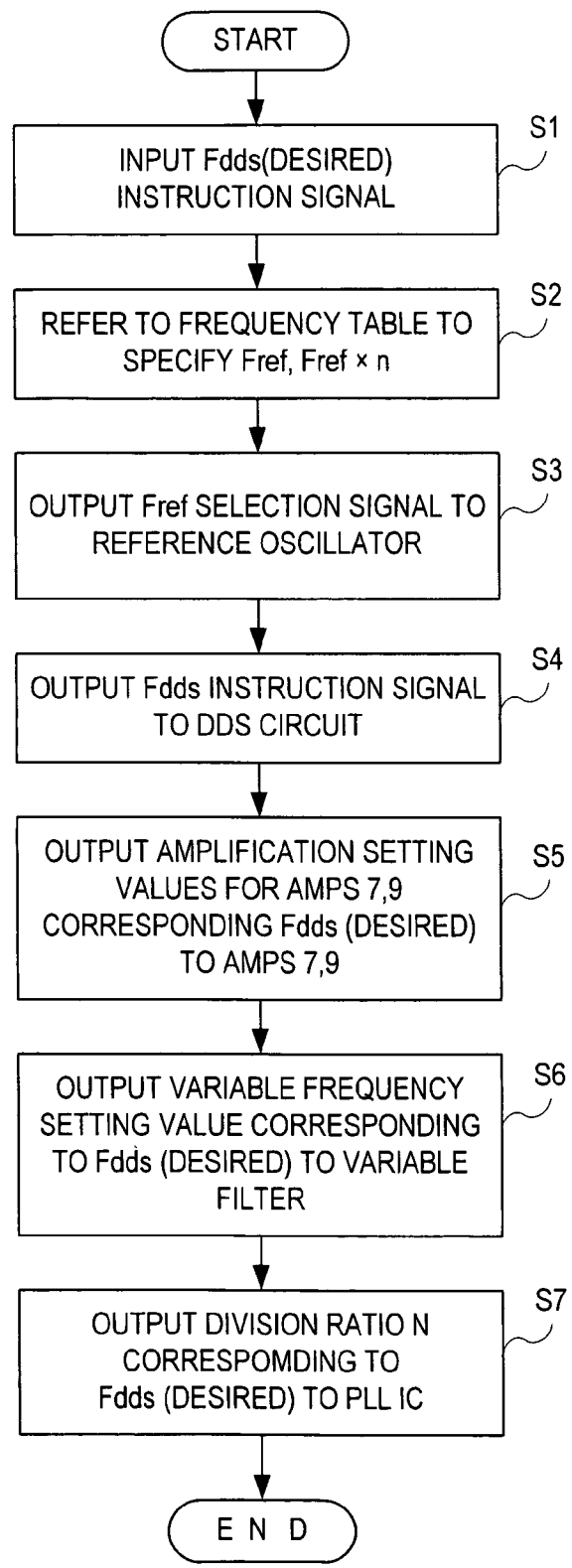
FIG. 7 is a flowchart for a controller.

[Controller Flow: FIG. 7]

Referring next to FIG. 7, the processing flow in the controller 61 is described below. FIG. 7 is a flowchart for the controller.

When receiving a Fdds (desired) instruction signal from the outside (an operator or a person who configures the circuit) (S1), the controller 61 refers to the frequency table 62 to specify Fref, Fref×n and Fdds (S2), outputs a Fref selection signal to the reference oscillator 4 (S3), and outputs a Fdds instruction signal to the DDS circuit 5 (S4).

Further, the controller 61 refers to the setting value correspondence table 63 and outputs amplification setting values for the AMPs 7 and 9 corresponding to the Fdds (desired) to the AMPs 7 and 9 (S5).

The controller 61 further refers to the setting value correspondence table 63, outputs a variable frequency setting value corresponding to the Fdds (desired) to the variable filter 8 (S6), and outputs a division ratio N corresponding to the Fdds (desired) to the PLL IC 2 (S7).

Figure 8:
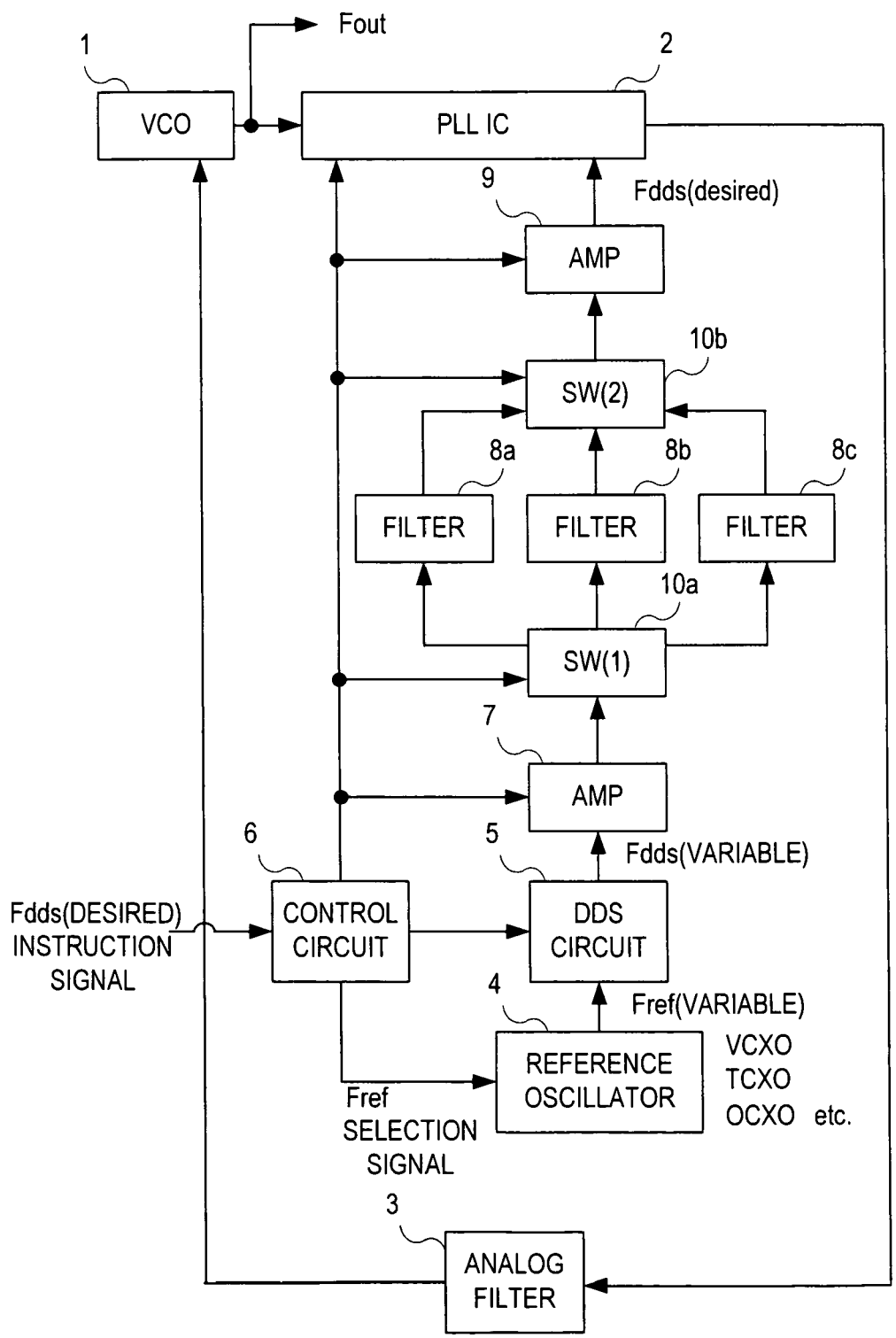
FIG. 8 illustrates the configuration of a PLL circuit according to a second embodiment.
Figure 9:
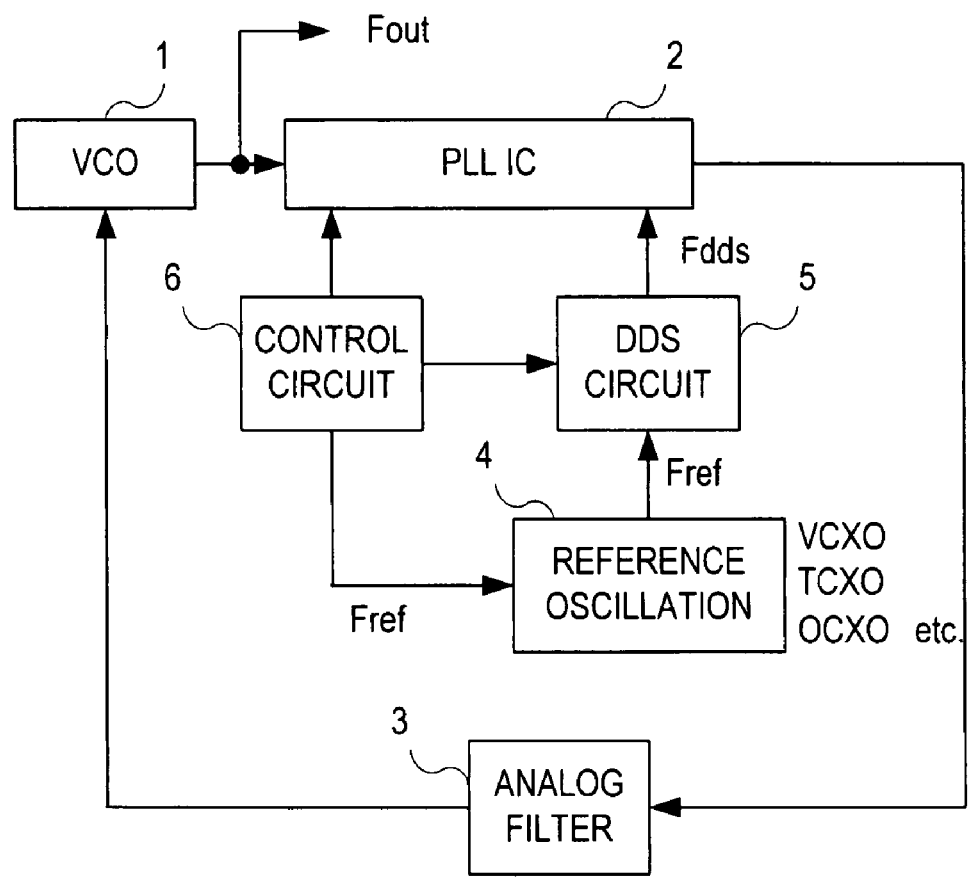
FIG. 9 illustrates the configuration of a conventional PLL circuit.

[Second PLL Circuit: FIG. 8]

Referring next to FIG. 8, a PLL circuit (second PLL circuit) according to a second embodiment is described below. FIG. 8 illustrates the configuration of the PLL circuit according to the second embodiment.

As illustrated in FIG. 8, the second PLL circuit is different from the first PLL circuit of FIG. 1 in that a plurality of filters 8a, 8b and 8c, and a first switch (SW(1)) 10a and a second switch (SW(2)) 10b to select these filters are provided instead of the variable filter 8.

In FIG. 1, the control circuit 6 outputs a variable frequency setting value to the variable filter 8. In FIG. 8, however, the control circuit 6 outputs an instruction signal for filter selection to the SW(1) 10a and the SW(2) 10b.

FIG. 8 illustrates three filters 8a to 8c, which may be two or four or more.

[Different Units]

The following describes units of the second PLL circuit that are different from the first PLL circuit.

The first AMP 7 outputs an amplification output to the SW(1) 10a.

The SW(1) 10a outputs the amplification signal from the first AMP 7 to a filter that is selected in accordance with a filter selection signal from the control circuit 6.

The SW(2) 10b selects the output from the filter that is selected in accordance with the filter selection signal from the control circuit 6 and outputs the same to the second AMP 9.

The second AMP 9 amplifies the output from the SW(2) 10b and outputs the same to the PLL IC 2 as Fdds (desired).

Then, the control circuit 6 outputs, to the SW(1) 10a and the SW(2) 10b, a filter selection instruction signal to select a filter to be used.

Thus, in the configuration inside the controller, the setting value correspondence table 63 stores a filter selection instruction signal to the two switches to select a filter to be used instead of the variable frequency setting value, and the controller 61 refers to the setting value correspondence table 63 in response to a Fdds (desired) instruction signal and outputs a filter selection instruction signal to the two SWs.

Advantages of Embodiments

In the PLL circuits according to embodiments of the present invention, both of the values for Fref and Fdds can be set finely, so that a fine and wide range of Fdds (desired) can be created from the combination of these values, and the variable filter 8 or the plurality of filters 8a to 8c select a desired Fdds (desired) and supplies the same to the PLL IC 2.

Therefore the PLL circuits have the advantages of improving reliability of the circuit while suppressing power consumption of the PLL circuit by suppressing power consumption of the DDS circuit 5 without degrading noise characteristics.

The present invention is suitable for a PLL circuit capable of improving reliability while suppressing power consumption without degrading noise characteristics.

What is claimed is:

1. A PLL circuit including a voltage controlled oscillator and phase comparison means that frequency-divides an output of the voltage controlled oscillator, compares phase between the output and a reference signal and outputs a signal based on a phase difference as a control voltage for the voltage controlled oscillator, comprising:
   a reference oscillator that makes a reference frequency variable in accordance with a reference frequency selection signal and outputs the reference frequency;
   a DDS circuit that outputs an output signal based on a reference frequency input and in response to an external output instruction signal, while outputting a folding signal of an output signal for the reference frequency and an integral multiple of the reference frequency;
   a first amplifier that amplifies an output signal from the DDS circuit with a first amplification setting value externally input;
   a variable filter that makes a frequency pass band thereof variable in accordance with a variable frequency setting value externally input and lets an output signal from the first amplifier pass therethrough;
   a second amplifier that amplifies an output signal from the variable filter with a second amplification setting value externally input and outputs the amplified signal to the phase comparison means as a reference signal; and
   a control circuit that, when an instruction signal is input to instruct to make the reference signal at a desired frequency, outputs a reference frequency selection signal corresponding to the instruction signal to the reference oscillator, outputs an output instruction signal corresponding to the instruction signal to the DDS circuit, outputs a first amplification setting value corresponding to the instruction signal to the first amplifier, outputs a variable frequency setting value corresponding to the instruction signal to the variable filter, outputs a second amplification setting value corresponding to the instruction signal to the second amplifier, and outputs a division ratio to the phase comparison means.

2. The PLL circuit according to claim 1, wherein the control circuit outputs a reference frequency selection signal and an output instruction signal that make both of a reference frequency in the reference oscillator and an output signal in the DDS circuit variable so as to make a reference signal at a desired frequency.

3. The PLL circuit according to claim 1, wherein the control circuit makes the DDS circuit generate a folding frequency of an output signal for a reference frequency and an integral multiple of the reference frequency and outputs a variable frequency setting value to allow the variable filter to select a desired frequency so as to make a reference signal at the desired frequency.

4. The PLL circuit according to claim 2, wherein the control circuit makes the DDS circuit generate a folding frequency of an output signal for a reference frequency and an integral multiple of the reference frequency and outputs a variable frequency setting value to allow the variable filter to select a desired frequency so as to make a reference signal at the desired frequency.

5. The PLL circuit according to claim 1, wherein the control circuit comprises: a frequency table that stores a reference frequency selection signal and an output instruction signal so as to correspond to an instruction signal input, a setting value correspondence table that stores a first amplification setting value, a second amplification setting value, a variable frequency setting value and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, variable frequency setting value and division ratio.

6. The PLL circuit according to claim 2, wherein the control circuit comprises: a frequency table that stores a reference frequency selection signal and an output instruction signal so as to correspond to an instruction signal input, a setting value correspondence table that stores a first amplification setting value, a second amplification setting value, a variable frequency setting value and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, variable frequency setting value and division ratio.

7. The PLL circuit according to claim 3, wherein the control circuit comprises: a frequency table that stores a reference frequency selection signal and an output instruction signal so as to correspond to an instruction signal input, a setting value correspondence table that stores a first amplification setting value, a second amplification setting value, a variable frequency setting value and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, variable frequency setting value and division ratio.

8. The PLL circuit according to claim 4, wherein the control circuit comprises: a frequency table that stores a reference frequency selection signal and an output instruction signal so as to correspond to an instruction signal input, a setting value correspondence table that stores a first amplification setting value, a second amplification setting value, a variable frequency setting value and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, variable frequency setting value and division ratio.

9. A PLL circuit including a voltage controlled oscillator and phase comparison means that frequency-divides an output of the voltage controlled oscillator, compares phase between the output and a reference signal and outputs a signal based on a phase difference as a control voltage for the voltage controlled oscillator, comprising:
   a reference oscillator that makes a reference frequency variable in accordance with a reference frequency selection signal and outputs the reference frequency;
   a DDS circuit that outputs an output signal based on a reference frequency input and in response to an external output instruction signal, while outputting a folding signal of an output signal for the reference frequency and an integral multiple of the reference frequency;

a first amplifier that amplifies an output signal from the DDS circuit with a first amplification setting value externally input;

a plurality of filters each having a different frequency pass band characteristic;

a first switch that selects one of the plurality of filters in accordance with a selection signal externally input and outputs an output signal from the first amplifier to the selected filter;

a second switch that selects the selected filter in accordance with a selection signal externally input and outputs an output signal from the filter;

a second amplifier that amplifies an output signal from the second switch with a second amplification setting value externally input and outputs the amplified signal to the phase comparison means as a reference signal; and a control circuit that, when an instruction signal is input to instruct to make the reference signal at a desired frequency, outputs a reference frequency selection signal corresponding to the instruction signal to the reference oscillator, outputs an output instruction signal corresponding to the instruction signal to the DDS circuit, outputs a first amplification setting value corresponding to the instruction signal to the first amplifier, outputs a second amplification setting value corresponding to the instruction signal to the second amplifier, outputs a selection signal corresponding to the instruction signal to the first switch and the second switch, and outputs a division ratio to the phase comparison means.

10. The PLL circuit according to claim 9, wherein the control circuit outputs a reference frequency selection signal and an output instruction signal that make both of a reference frequency in the reference oscillator and an output signal in the DDS circuit variable so as to make a reference signal at a desired frequency.

11. The PLL circuit according to claim 9, wherein the control circuit makes the DDS circuit generate a folding frequency of an output signal for a reference frequency and an integral multiple of the reference frequency and outputs a selection signal to allow the first switch and the second switch to select a desired frequency so as to make a reference signal at the desired frequency.

12. The PLL circuit according to claim 10, wherein the control circuit makes the DDS circuit generate a folding frequency of an output signal for a reference frequency and an integral multiple of the reference frequency and outputs a selection signal to allow the first switch and the second switch to select a desired frequency so as to make a reference signal at the desired frequency.

13. The PLL circuit according to claim 9, wherein the control circuit comprises: a frequency table that stores a reference frequency selection signal and an output instruction signal so as to correspond to an instruction signal input, a setting value correspondence table that stores a first amplification setting value, a second amplification setting value, a selection signal and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, selection signal and division ratio.

14. The PLL circuit according to claim 10, wherein the control circuit comprises: a frequency table that stores a reference frequency selection signal and an output instruction signal so as to correspond to an instruction signal input, a setting value correspondence table that stores a first amplification setting value, a second amplification setting value, a selection signal and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, selection signal and division ratio.

15. The PLL circuit according to claim 11, wherein the control circuit comprises: a frequency table that stores a reference frequency selection signal and an output instruction signal so as to correspond to an instruction signal input, a setting value correspondence table that stores a first amplification setting value, a second amplification setting value, a selection signal and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, selection signal and division ratio.

16. The PLL circuit according to claim 12, wherein the control circuit comprises: a frequency table that stores a reference frequency selection signal and an output instruction signal so as to correspond to an instruction signal input, a setting value correspondence table that stores a first amplification setting value, a second amplification setting value, a selection signal and a division ratio so as to correspond to the instruction signal, and a controller that, in response to input of the instruction signal, refers to the frequency table and outputs a corresponding reference frequency selection signal and output instruction signal, and refers to the setting value correspondence table and outputs a corresponding first amplification setting value, second amplification setting value, selection signal and division ratio.

* * * * *